US009450600B2

(12) United States Patent
Chubachi et al.

(10) Patent No.: US 9,450,600 B2
(45) Date of Patent: Sep. 20, 2016

(54) DIGITAL-ANALOG CONVERTER AND DIGITAL-ANALOG CONVERSION DEVICE EXECUTING DIGITAL-ANALOG CONVERSION AFTER DELTA SIGMA

(71) Applicant: Asahi Kasei Microdevices Corporation, Tokyo (JP)

(72) Inventors: Tatsuya Chubachi, Tokyo (JP); Junya Nakanishi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/779,064

(22) PCT Filed: Mar. 19, 2014

(86) PCT No.: PCT/JP2014/001598
§ 371 (c)(1),
(2) Date: Sep. 22, 2015

(87) PCT Pub. No.: WO2014/156080
PCT Pub. Date: Oct. 2, 2014

(65) Prior Publication Data
US 2016/0056836 A1    Feb. 25, 2016

(30) Foreign Application Priority Data

Mar. 28, 2013  (JP) .................................. 2013-069481
Mar. 28, 2013  (JP) .................................. 2013-069483

(51) Int. Cl.
*H03M 3/00*       (2006.01)
*H03M 1/66*       (2006.01)
(Continued)

(52) U.S. Cl.
CPC ............ *H03M 3/374* (2013.01); *H03M 1/002* (2013.01); *H03M 1/0836* (2013.01);
(Continued)

(58) Field of Classification Search
CPC .......... H03M 3/30; H03M 1/66; H03M 3/344
USPC .................. 341/144, 143, 153, 118, 120, 122
See application file for complete search history.

(56) References Cited

U.S. PATENT DOCUMENTS 5,990,819 A     11/1999  Fujimori
6,501,409 B1 *  12/2002  Lynn ..................... H03M 1/804
                                                   341/146

(Continued)

FOREIGN PATENT DOCUMENTS

JP      S62-281521 A    12/1987
JP      H11-055121 A     2/1999
(Continued)

OTHER PUBLICATIONS

International Preliminary Report on Patentability and Written Opinion issued in corresponding International Patent Application No. PCT/JP2014/001598 dated Sep. 29, 2015.
(Continued)

*Primary Examiner* — Peguy Jean Pierre
(74) *Attorney, Agent, or Firm* — Morgan, Lewis & Bockius LLP

(57) ABSTRACT

The DA converter according to the present invention includes: first and second analog segment units a plurality of capacitors of sampling capacitor groups charged according to signal levels of digital signals input in a sampling phase; and a calculation unit that outputs an analog signal according to a charged voltage of each capacitor of the sampling capacitor group of the first or second analog segment unit in an integral phase, wherein, when one analog segment unit of the first and second analog segment units is in the sampling phase, the other analog segment unit is in the integral phase.

8 Claims, 13 Drawing Sheets

(51) Int. Cl.
 *H03M 1/00* (2006.01)
 *H03M 1/08* (2006.01)
 *H03M 1/80* (2006.01)

(52) U.S. Cl.
 CPC .......... *H03M 1/662* (2013.01); *H03M 1/802* (2013.01); *H03M 3/32* (2013.01); *H03M 3/502* (2013.01); *H03M 1/804* (2013.01)

(56) References Cited

U.S. PATENT DOCUMENTS

| | | | |
|---|---|---|---|
| 7,453,386 B2 * | 11/2008 | Jeon | H03M 1/68 341/122 |
| 7,573,411 B2 * | 8/2009 | Shin | H03M 1/667 341/144 |
| 2001/0052864 A1 | 12/2001 | Shimizu et al. | |
| 2004/0004565 A1 | 1/2004 | Melanson | |
| 2004/0193296 A1 | 9/2004 | Melanson | |
| 2005/0040979 A1 | 2/2005 | Brooks et al. | |
| 2006/0164274 A1 | 7/2006 | Nakakita et al. | |
| 2007/0040718 A1 * | 2/2007 | Lee | H03M 7/3008 341/143 |
| 2008/0303700 A1 * | 12/2008 | Tsuchi | H03F 1/083 341/100 |

FOREIGN PATENT DOCUMENTS

| | | |
|---|---|---|
| JP | 2000-013232 A | 1/2000 |
| JP | 2001-308804 A | 11/2001 |
| JP | 2005-532732 A | 10/2005 |
| JP | 2006-211045 A | 8/2006 |
| JP | 2006-524362 A | 10/2006 |
| JP | 2008-035038 A | 2/2008 |
| JP | 2012-015615 A | 1/2012 |

OTHER PUBLICATIONS

International Search Report issued in corresponding International Patent Application No. PCT/JP2014/001598 dated May 27, 2014.

* cited by examiner

DIGITAL-ANALOG CONVERTER AND DIGITAL-ANALOG CONVERSION DEVICE EXECUTING DIGITAL-ANALOG CONVERSION AFTER DELTA SIGMA

TECHNICAL FIELD

The present invention relates to a digital-analog converter converting a digital input signal to an analog output signal and a digital-analog conversion device executing digital-analog conversion after delta sigma (ΔΣ) modulation.

BACKGROUND ART

FIG. 1 illustrates a digital-analog conversion device of a switched capacitor filter (SCF) type according to a ΔΣ modulation system (hereinafter, referred to as an SCF-type ΔΣ DAC). As illustrated in FIG. 1, an SCF-type ΔΣ DAC 100 includes: a ΔΣ modulator 101 that executes ΔΣ modulation for input digital data; a DWA (data-weighted-averaging) processor 102 that converts a PDM signal output from the ΔΣ modulator 101 into a thermometer code, rotates the thermometer code, and outputs the rotated thermometer code; and an SCF 103 to which digital data output from the DWA processor 102 is input. The SCF-type ΔΣ DAC 100 is a device that converts input digital data into analog data and outputs the converted data.

An audio ΔΣ DAC for high end uses is particularly required to have a high SN ratio. Accordingly, it is necessary to suppress a system noise of the ΔΣ modulator 101, a kT/C noise of the SCF 103, and the like. The ΔΣ modulator 101 can shift a low-frequency noise to a high-frequency noise based on the noise shaping characteristics thereof and thus, can reduce the amount of noise within the frequency band.

The SN ratio of the ΔΣ modulator 101 is determined based on an order L, an oversampling ratio (OSR) M, and the number B of output bits. Equation (1) represents an equation for calculating the SN ratio.

[Formula 1]

$$SN = 10\log\left(\frac{3}{2}\frac{2L+1}{\pi^{2L}}M^{2L+1}(2^B-1)^2\right)$$

Equation (1)

For the achievement of high performance of the ΔΣ modulator 101, particularly the SN ratio can be improved considerably by increasing the OSR. In Patent literature 1, a ΔΣ DAC using a high OSR is disclosed. FIG. 2 illustrates the noise shaping characteristic of a ΔΣ modulator of the third order and the noise shaping characteristic at the time of doubling the OSR. As illustrated in FIG. 2, by doubling the OSR, the amount of noise within the frequency band (within fb=20 kHz) can be suppressed.

In addition, for example, in Patent literature 2, a ΔΣ modulator including a switched capacitor circuit is disclosed. Furthermore, in Patent literature 3, a ΔΣ-type D/A converter including a ΔΣ modulator is disclosed.

CITATION LIST

Patent Literature

PTL 1: Japanese Patent Laid-Open No. 2006-524362
PTL 2: Japanese Patent Laid-Open No. 2006-211045
PTL 3: Japanese Patent Laid-Open No. 2008-35038
PTL 4: Japanese Patent Laid-Open No. 2012-015615

SUMMARY OF INVENTION

Technical Problem

However, by increasing the OSR, current consumption in an analog unit increases. Since an SCF of a DAC is operated using a clock (Fs=OSR·fs) over-sampled with respect to a sampling frequency (fs), the analog clock rate increases by increasing the OSR. For this reason, it is necessary to extend the frequency band of an operational amplifier used in the SCF. According to the extended frequency band of the operational amplifier, the slew rate (dV/dt) of the operational amplifier increases, and the settling time is shortened. Thus, as a result, the current consumption increases. Equation (2) represents a relational expression of the slew rate and the current consumption.

[Formula 2]

$$I = C\frac{dV}{dt}$$

Equation (2)

As represented in Equation (2), the current consumption is represented as the product of the slew rate and load capacitance. An operational amplifier that is generally used in the SCF has a configuration of two-stage amplifiers or the like, the load is constant, and current consumption is proportional to the slew rate. In other words, by increasing the OSR of the ΔΣ modulator to implement high-speed digital data, the analog rate increases as well, and, as a result, the current consumption in the analog unit increases.

According to the present invention, digital data is divided into two parts, the data rate of each part is down-sampled, and two analog segments are arranged in correspondence with two data paths and execute a time-interleaving operation, whereby each rate in the analog unit can be decreased by half (OSR·fs/2) with respect to the original over-sampled rate (OSR·fs).

Here, while the time-interleaving, as disclosed in Patent literature 4, is a technology that is mainly used for an analog-digital conversion device and the like, no configuration applied to a digital-analog conversion device has been disclosed.

The present invention is devised in consideration of such problems, and an object thereof is to provide an SCF-type ΔΣ digital-analog conversion device capable of decreasing the current consumption in the analog unit to be less than that of a conventional case for a high OSR of ΔΣ.

Solution to Problem

According to claim 1 of the present invention, there is provided a digital-analog converter including: a first analog segment unit that includes a first sampling switch group and a first sampling capacitor group, a plurality of capacitors of the first sampling capacitor group being charged according to a signal level of a first digital signal in a sampling phase; a second analog segment unit that includes a second sampling switch group and a second sampling capacitor group, a plurality of capacitors of the second sampling capacitor group being charged according to a signal level of a second digital signal in the sampling phase; and a calculation unit that includes an operational amplifier and an integration capacitor and outputs an analog signal according to a charged voltage of each capacitor of the first sampling capacitor group or a charged voltage of each capacitor of the second sampling capacitor group in an integral phase, wherein, when one analog segment unit of the first and second analog segment units is in the sampling phase, the other analog segment unit is in the integral phase.

According to a digital-analog converter described in claim 2 of the present invention, in the digital-analog converter described in claim 1 of the present invention, the first sampling switch group is switched to cause the first analog segment unit to be connected to an input terminal to which the first digital signal is input and a reference voltage in the sampling phase and is switched to cause the first analog segment unit to be connected to the calculation unit in the integral phase, and the second sampling switch group is switched to cause the second analog segment unit to be connected to an input terminal to which the second digital signal is input and the reference voltage in the sampling phase and is switched to cause the second analog segment unit to be connected to the calculation unit in the integral phase.

According to claim 3 of the present invention, there is provided a digital-analog conversion device including: a delta sigma modulator; a DWA processor that is electrically connected to the delta sigma modulator; and the digital-analog converter described in claim 1 or 2 that is electrically connected to the DWA processor.

According to claim 4 of the present invention, there is provided a digital-analog conversion device including: a delta sigma modulator; a two-tap digital FIR filter that is electrically connected to the delta sigma modulator; a DWA processor that is electrically connected to the two-tap digital FIR filter; and the digital-analog converter described in claim 1 or 2 that is electrically connected to the DWA processor.

According to claim 5 of the present invention, there is provided a digital-analog conversion device including: a delta sigma modulator; a DWA processor that is electrically connected to the delta sigma modulator; a two-tap analog FIR filter that is electrically connected to the DWA processor; and the digital-analog converter described in claim 1 or 2 that is electrically connected to the two-tap analog FIR filter.

According to claim 6 of the present invention, there is provided a digital-analog converter including: three or more analog segment units each including a sampling switch group and a sampling capacitor group and being connected to an input terminal to which a digital signal is input and a reference voltage in a sampling phase, a plurality of capacitors of the sampling capacitor group being charged according to a signal level of the input digital signal; and a calculation unit that includes an operational amplifier and an integration capacitor and, in an integral phase, is connected to one analog segment unit of the three or more analog segment units and outputs an analog signal according to a charged voltage of each capacitor of the sampling capacitor group of the connected analog segment unit, wherein the digital signal is input sequentially to the three or more analog segment units, and, when, among the three or more analog segment units, a first analog segment unit is in the sampling phase, a second analog segment unit is in the integral phase, and the other analog segment units are in an empty phase of not being connected to the reference voltage, the input terminal, and the calculation unit.

According to a digital-analog conversion device described in claim 7 of the present invention, in the digital-analog conversion device described in claim 6 of the present invention, the sampling switch group of each of the three or more analog segment units is switched to cause the analog segment unit to be connected to the input terminal to which the digital signal is input and the reference voltage in the sampling phase, is switched to cause the analog segment unit to be connected to the calculation unit in the integral phase, and is switched to cause the analog segment unit not to be connected to the reference voltage, the input terminal, and the calculation unit in the empty phase.

According to claim 8 of the present invention, there is provided a digital-analog conversion device including: a delta sigma modulator; a DWA processor that is electrically connected to the delta sigma modulator; and the digital-analog converter described in claim 6 or 7 that is electrically connected to the DWA processor.

Advantageous Effects of Invention

In an ordinary SCF operation, a sampling phase and an integral phase are alternately repeated. At this time, in the sampling phase, amplification is not necessary, and thus, there is a standby time corresponding to a half phase.

According to the present invention, by using this standby time, first, digital data is divided into two parts for down-sampling the data rate thereof, and two analog segments are arranged in correspondence with two data paths, and a time-interleaving operation is executed. Accordingly, the rate of the analog unit can be decreased by half (OSR·fs/2) of the original over-sampled rate (OSR·fs).

In a time-interleaved DAC, since data that has been converted from digital to analog by each analog segment is added together, the rate seen from the output is not changed from the over-sampled sampling rate (OSR·fs).

Thus, according to the present invention, a high OSR of $\Delta\Sigma$ can be realized with current consumption lower than that of a conventional case by executing the time-interleaved DAC operation described above.

DESCRIPTION OF EMBODIMENTS

Hereinafter, embodiments of the present invention will be described with reference to the drawings.

Figure 1:
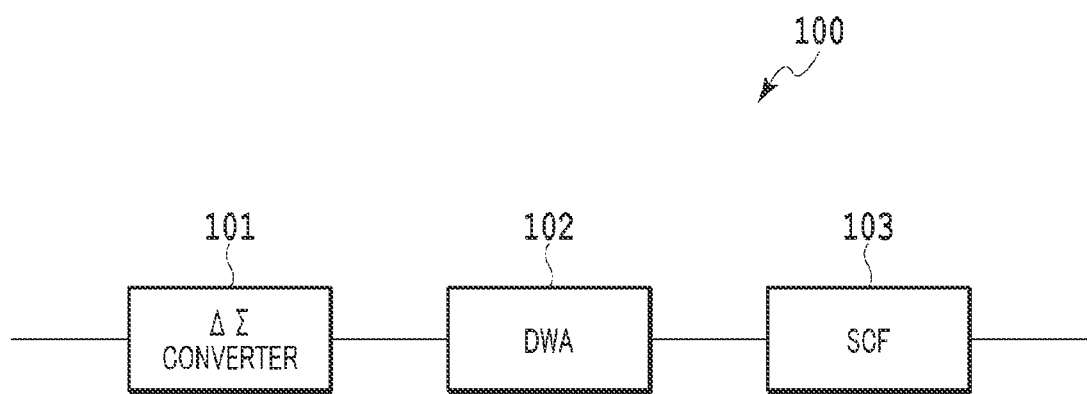
FIG. 1 is a block diagram of an SCF-type $\Delta\Sigma$ DC.
Figure 2:
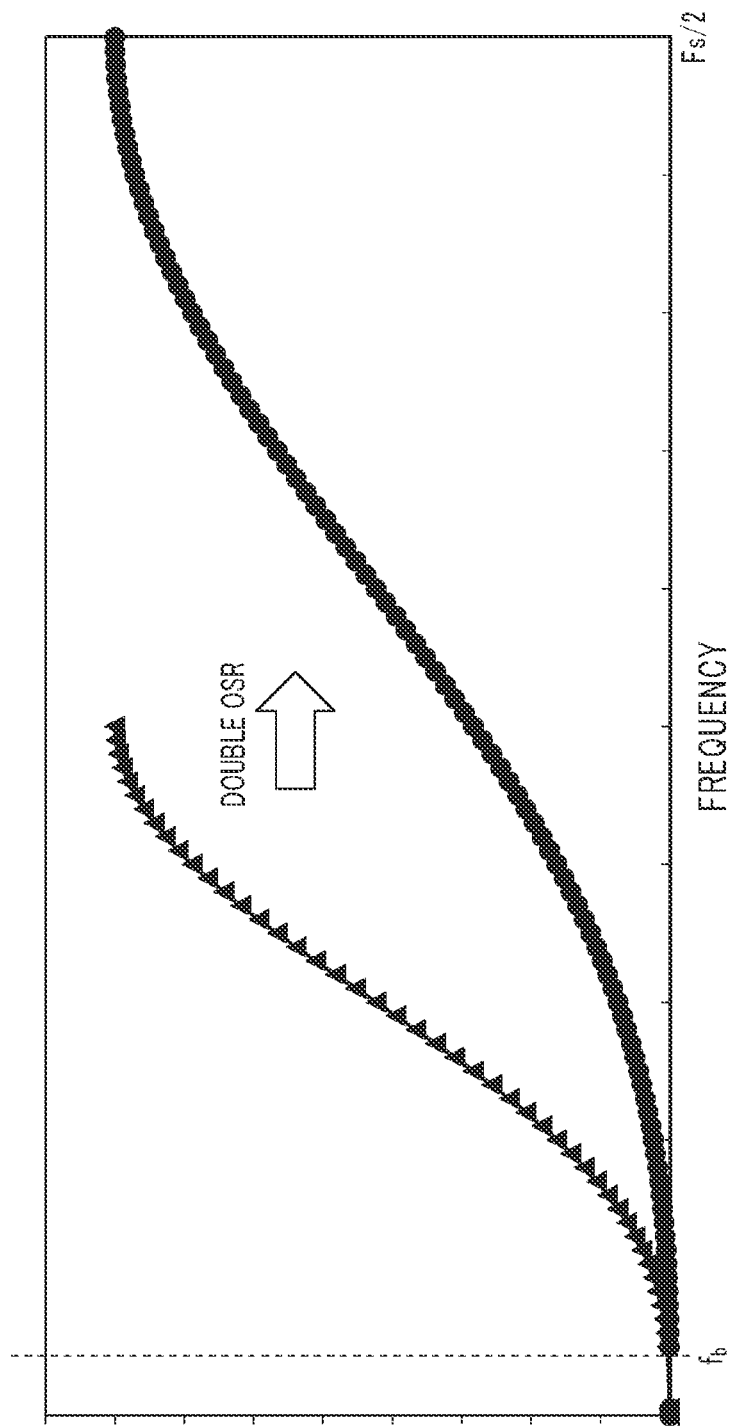
FIG. 2 is a diagram that illustrates the noise shaping characteristic of a $\Delta\Sigma$ modulator of the third order and the noise shaping characteristic at the time of doubling an OSR.
Figure 3A:
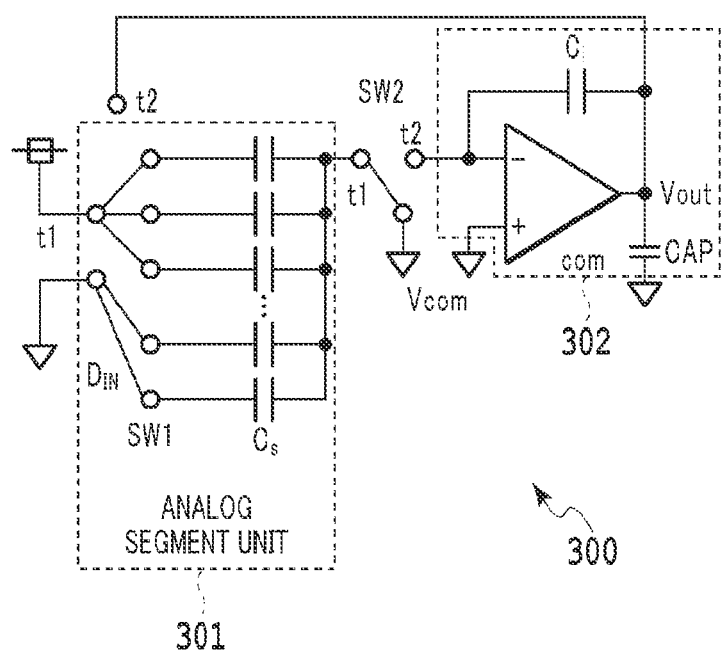
FIG. 3A is a diagram that illustrates a configuration diagram of a general SCF and an operation executed in a sampling phase.
Figure 3B:
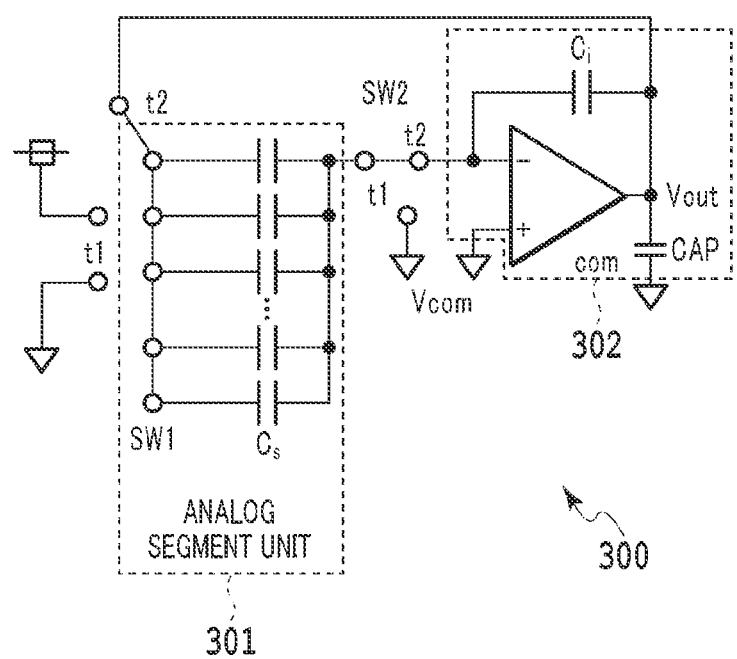
FIG. 3B is a diagram that illustrates a configuration diagram of a general SCF and an operation executed in an integral phase.
Figure 4:
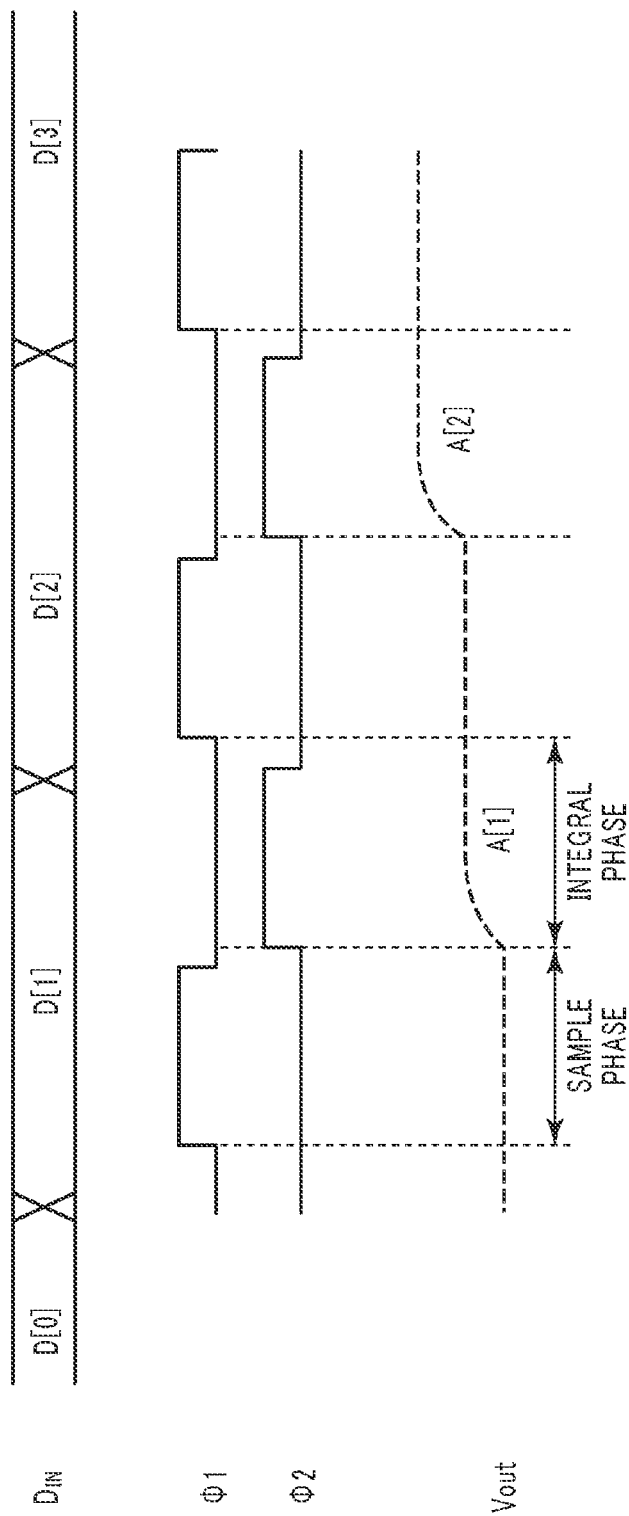
FIG. 4 is a timing diagram of the configurations illustrated in FIGS. 3A and 3B.

First, the operation of a general SCF will be described. FIGS. 3A and 3B illustrate configuration diagrams of a general SCF and operations executed in phases. FIG. 4 illustrates a timing diagram of the configurations illustrated in FIGS. 3A and 3B.

As illustrated in FIGS. 3A and 3B, an SCF 300 includes: an analog segment unit 301; a switch SW2; and a calculation unit 302. The analog segment unit 301 includes: a sampling switch group SW1; and a sampling capacitor group Cs. The calculation unit 302 includes: an integration capacitor Ci; an operational amplifier COM; and a capacitor CAP. The switch SW2 is disposed between the analog segment unit 301 and the calculation unit 302. The negative-side input terminal of the operational amplifier COM is connected to the switch SW2. The integration capacitor Ci is connected in parallel with the negative-side input terminal of the operational amplifier COM and the output terminal of the operational amplifier COM. The capacitor CAP is connected to the output terminal of the operational amplifier COM. The sampling switch group SW1 and the switch SW2 are switched to a first terminal t1 according to a clock $\phi1$ to be described later and are switched to a second terminal t2 according to a clock $\phi2$ to be described later.

As illustrated in FIG. 3A, in the sampling phase, the sampling switch group SW1 and the switch SW2 are switched to the first terminal t1, the analog segment unit 301 is connected to an input terminal to which a digital input signal is input and a reference voltage, and capacitors of the sampling capacitor group Cs are charged according to a signal level of the digital input signal input to the analog segment unit 301.

As illustrated in FIG. 3B, in the integral phase, the sampling switch group SW1 and the switch SW2 are switched to the second terminal t2, the analog segment unit 301 is connected to the calculation unit 302, and the operational amplifier 302 outputs an analog output signal according to the charged voltage of the capacitors of the sampling capacitor group Cs.

As illustrated in FIG. 4, the sampling phase and the integral phase are alternately repeated in synchronization with clocks $\phi1$ and $\phi2$ having a cycle of OSR·fs. The sampling phase is started at the rising edge of the clock $\phi1$, and the integral phase is started at the rising edge of the clock $\phi2$.

Figure 5A:
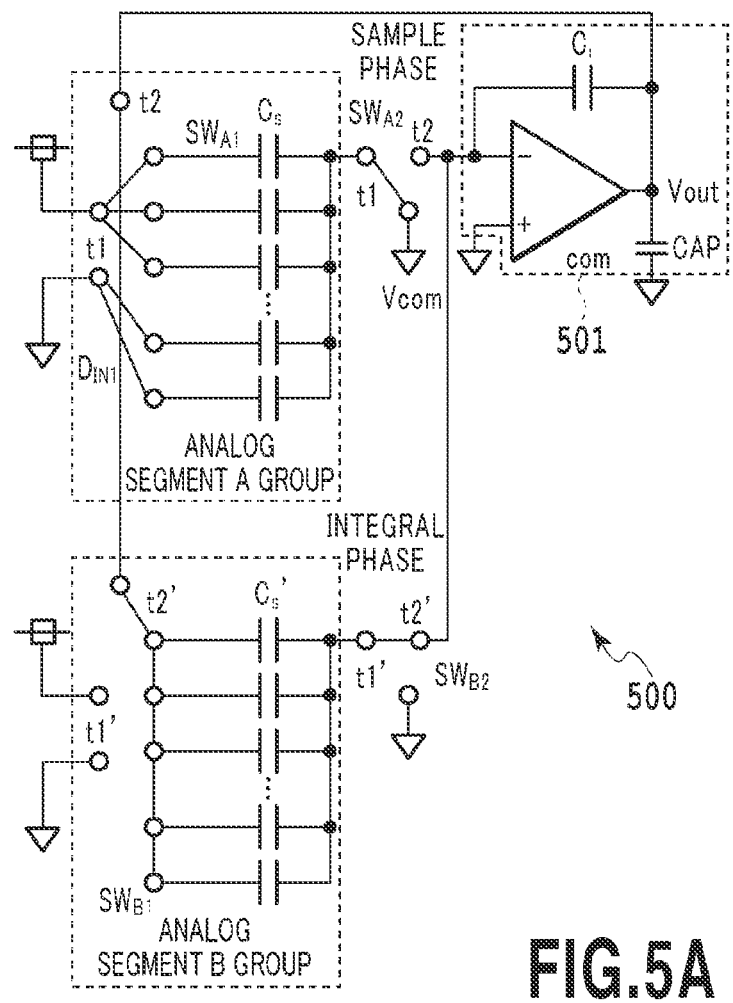
FIG. 5A is a configuration diagram of an SCF of a time-interleaved DAC according to the present invention and is an explanatory diagram of the operation thereof.
Figure 5B:
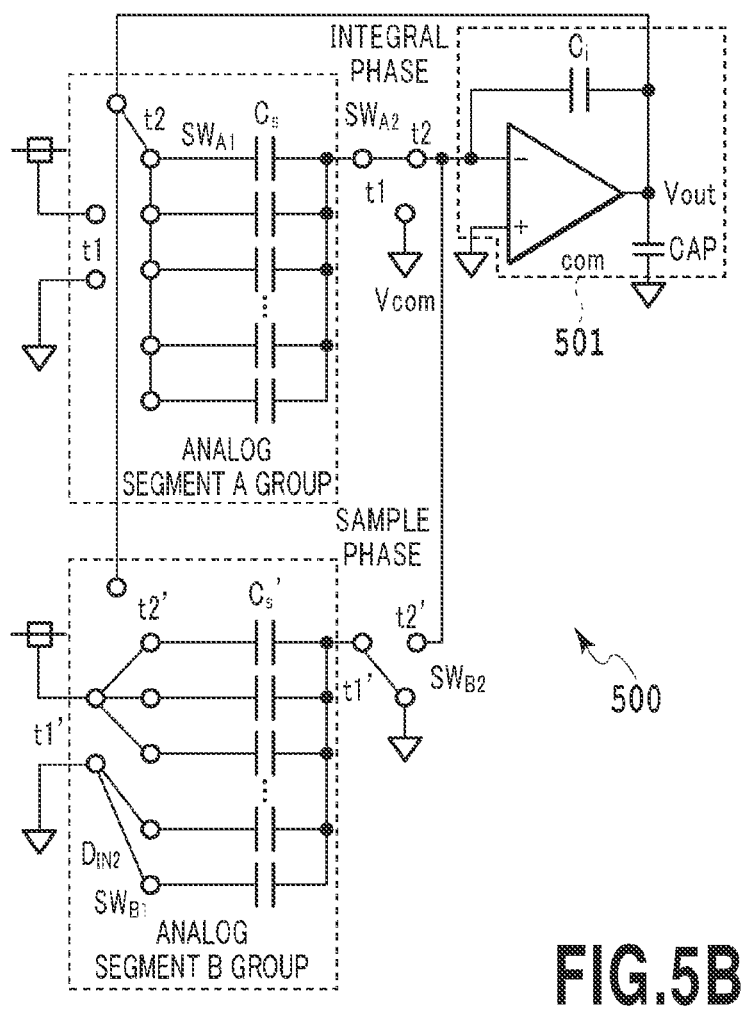
FIG. 5B is a configuration diagram of an SCF of a time-interleaved DAC according to the present invention and is an explanatory diagram of the operation thereof.
Figure 6:
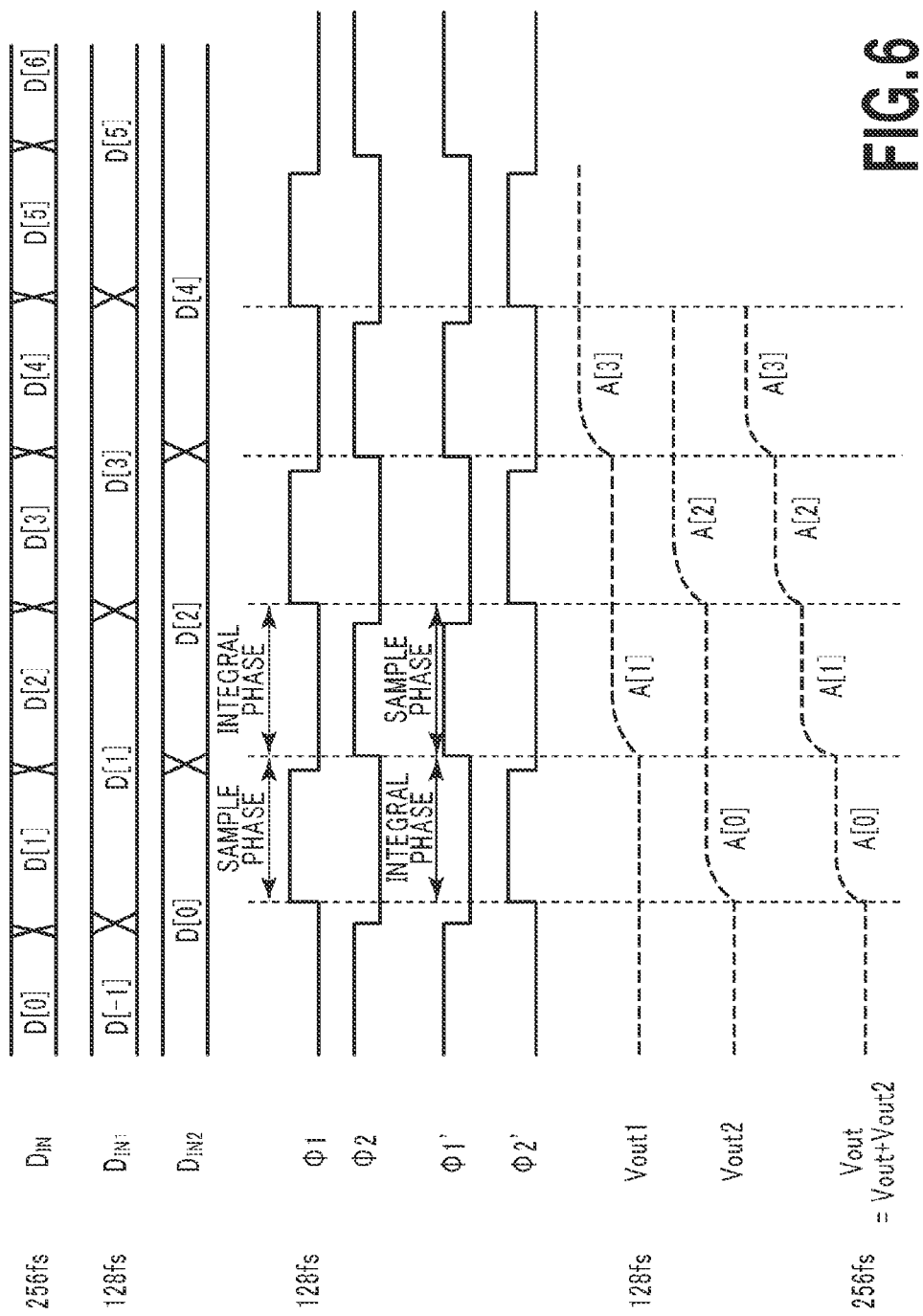
FIG. 6 is a timing diagram according to the configurations illustrated in FIGS. 5A and 5B.

Next, an SCF operation executed by the time-interleaved DAC according to the present invention will be described. FIGS. 5A and 5B illustrate the configuration diagrams and the operations of the SCF of the time-interleaved DAC according to the present invention. In addition, FIG. 6 illustrates a timing diagram according to the configurations illustrated in FIGS. 5A and 5B.

As illustrated in FIGS. 5A and 5B, an SCF 500 of the time-interleaved DAC according to the present invention includes: an analog segment A group; an analog segment B group; a first switch $SW_{A2}$; a second switch $SW_{B2}$; and a calculation unit 501. The analog segment A group includes a first sampling switch group $SW_{A1}$ and a first sampling capacitor group Cs, and the analog segment B group includes a second sampling switch group $SW_{B1}$ and a second sampling capacitor group Cs'. The calculation unit 501 includes: an operational amplifier COM; an integration capacitor Ci; and a capacitor CAP.

The first switch $SW_{A2}$ is connected to the analog segment A group, the second switch $SW_{B2}$ is connected to the analog segment B group, and the negative-side input terminal of the operational amplifier COM is connected to the first switch $SW_{A2}$ and the second switch $SW_{B2}$. The integration capacitor Ci is connected in parallel with the negative-side input terminal of the operational amplifier COM and the output terminal of the operational amplifier COM. The capacitor CAP is connected to the output terminal of the operational amplifier COM.

The first sampling switch group $SW_{A1}$ and the first switch $SW_{A2}$ are switched to a first terminal t1 according to a clock $\phi1$ and are switched to a second terminal t2 according to a clock $\phi2$. The second sampling switch group $SW_{B1}$ and the second switch $SW_{B2}$ are switched to a first terminal t1' according to a clock $\phi1'$ and are switched to a second terminal t2' according to a clock $\phi2'$. In order to divide data into two parts by executing a time-interleaving operation and individually executing DA conversion of each part of the data, the SCF 500 includes the analog segment A group and the analog segment B group.

In the time-interleaving operation, as illustrated in FIG. 5A, the first sampling switch group $SW_{A1}$ and the first switch $SW_{A2}$ are switched to the first terminal t1, the second sampling switch group $SW_{B1}$ and the second switch $SW_{B2}$ are switched to the second terminal t2', the analog segment A group is allocated to the sampling phase, and the analog segment B group is allocated to the integral phase. In the configuration illustrated in FIG. 5A, the analog segment A group is connected to the input terminal to which the digital input signal is input, and the analog segment B group is connected to the calculation unit 501.

In a next phase, as illustrated in FIG. 5B, the first sampling switch group $SW_{A1}$ and the first switch $SW_{A2}$ are switched to the second terminal t2, and the second sampling switch group $SW_{B1}$ and the second switch $SW_{B2}$ are switched to the first terminal t1'. Accordingly, the analog segment A group is switched to the integral phase, and the analog segment B group is switched to the sampling phase. In the configuration illustrated in FIG. 5B, the analog segment B group is connected to the input terminal to which the digital input signal is input, and the analog segment A group is connected to the calculation unit 501. The operations illustrated in FIGS. 5A and 5B are alternately repeated.

More specifically, a case will be described in which the OSR is increased from a 128-times OSR (6.144 MHz operation) to a 256-times OSR (12.288 MHz operation) (fs=48 kHz). First, input digital data $D_{IN}$ (256 fs, 12.288 MHz) is divided into two parts. At this time, since the input digital data $D_{IN}$ is divided into one part that is odd-numbered digital data $D_{IN1}$ and the other part that is even-numbered digital data $D_{IN2}$, the rates of the digital data $D_{IN1}$ and $D_{IN2}$ can be decreased by half to 128 fs=6.144 MHz. The relation between the phases thereof, as illustrated in a timing diagram of FIG. 6, has a half-phase shift.

Since the digital data $D_{IN1}$ and the digital data $D_{IN2}$ after the division are operated at 6.144 MHz, the analog segment A group and the analog segment B group can be operated according to the clock of 6.144 MHz ($\phi1$, $\phi2$, $\phi1'$, and $\phi2'$). By individually executing an SCF operation for the each of the divided data $D_{IN1}$ and $D_{IN2}$ by using the analog segment A group and the analog segment B group, the data is converted from digital to analog (DA).

Virtually, when converted data acquired by the DA conversion of the divided data $D_{IN1}$ is denoted by $V_{OUT1}$, and converted data acquired by the DA conversion of the divided data $D_{IN2}$ is denoted by $V_{OUT2}$, actual output $V_{OUT}$ is acquired by adding the data $V_{OUT1}$ and the data $V_{OUT}2$, and the output $V_{OUT}$ after the addition is operated at 12.288 MHz. This output data is equivalent to the output $V_{OUT}$ when the OSR is simply multiplied by 256 times.

According to the SCF 500 of the present invention, depending on the determination of the OSR, relative to a conventional case, high performance of the ΔΣ DAC or low power consumption of the ΔΣ DAC can be realized. In the following first embodiment, a form of the high performance of the ΔΣ DAC will be described as an example, and the form of low power consumption of the ΔΣ DAC will be described as an example in a second embodiment.

<First Embodiment>

According to the SCF 500 of the present invention, even if the time-interleaving operation is executed with the OSR being double that of a conventional case, the time-interleaving operation can be executed with current consumption that is at the same level as that of a conventional case, whereby high performance of the ΔΣ modulator can be achieved. For example, for a ΔΣ modulator of the third order, by setting the rate of the digital unit to a 256 OSR that is double the 128 OSR of a conventional case, the SN ratio can be improved by 21 dB. In addition, by the time-interleaved DAC operation executed by the SCF 500 according to the present invention, the operation can be executed at an analog rate (OSR·fs/2) that is decreased by half with respect to the over-sampled rate (Fs=OSR·fs), and accordingly, the current consumption is at the same level as that of a conventional case, whereby a disadvantage according to the raise of the OSR can be resolved.

<Second Embodiment>

With the same OSR as that of a conventional case, by the time-interleaved DAC operation executed by the SCF 500 according to the present invention, the ΔΣ modulator can decrease the operation rate of the analog unit by half with the same level of the SN ratio as that until now compared to the conventional case, whereby low current consumption of the ΔΣ DAC can be achieved.

In addition, in the SCF 500 according to the present invention, as described above, since DWA is individually executed for the analog segment A group used for DA conversion of odd-numbered data and the analog segment B group used for DA conversion of even-numbered data, there are cases where there is a capacitor mismatch between the analog segment A group and the analog segment B group. This capacitor mismatch causes a gain error between the even-numbered data and the odd-numbered data.

The gain error between the even-numbered data and the odd-numbered data causes a bit having a frequency of ½·Fs. The generated bit of ½·Fs is cross-modulated with a noise outside of the frequency band and is returned to the inside of the frequency band. For this reason, by suppressing noises outside of the frequency band near ½·Fs in advance, an effective countermeasure against a gain error is achieved.

Hereinafter, technologies for correcting a capacitor mismatch between the analog segment A group and the analog segment B group will be described in third and fourth embodiments.

<Third Embodiment>

Figure 7:
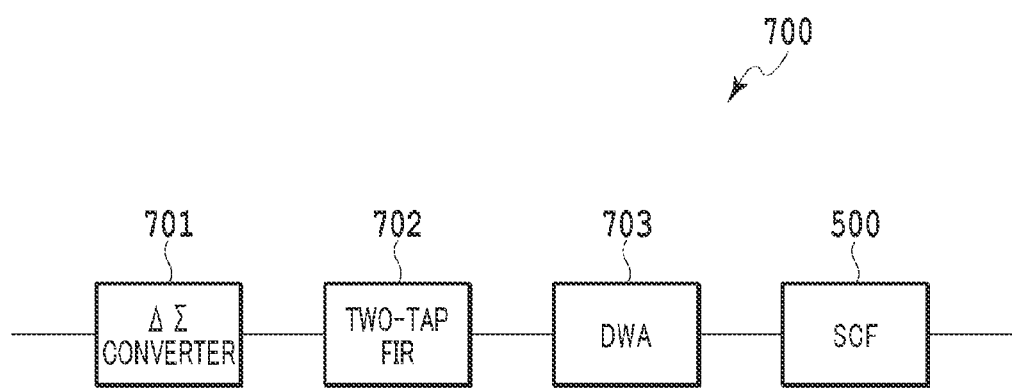
FIG. 7 is a block diagram of an SCF-type $\Delta\Sigma$ DC according to a third embodiment of the present invention.

FIG. 7 is a block diagram of an SCF-type ΔΣ DAC according to the third embodiment of the present invention.

FIG. 7 illustrates an SCF-type ΔΣ DAC 700 including: a ΔΣ modulator 701; a two-tap digital finite impulse response (FIR) 702 that is electrically connected to the ΔΣ modulator 701; a DWA processor 703 that is electrically connected to the two-tap digital FIR 702; and the SCF 500 according to the present invention that is electrically connected to the DWA processor 703. As illustrated in FIG. 7, the two-tap digital FIR 702 is inserted between the ΔΣ modulator 701 and the DWA processor 703.

Since the two-tap digital FIR 702 has a zero at ½·Fs, a noise outside the frequency band present at ½·Fs generated by the ΔΣ modulator 701 can be completely filtered. Accordingly, the return of a noise to the inside of the frequency band due to cross modulation of a bit according to a gain error and a noise outside the frequency band can be suppressed.

<Fourth Embodiment>

Figure 8:
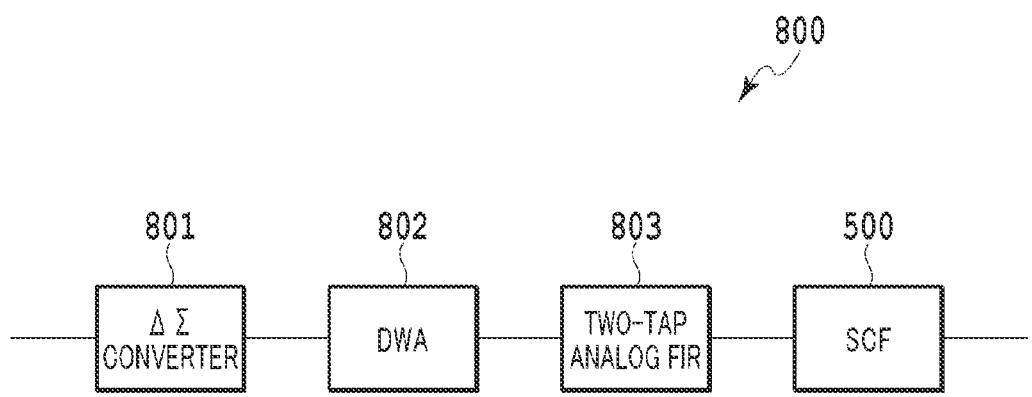
FIG. 8 is a block diagram of an SCF-type $\Delta\Sigma$ DC according to a fourth embodiment of the present invention.

FIG. 8 is a block diagram of an SCF-type ΔΣ DAC according to the fourth embodiment of the present invention. FIG. 8 illustrates an SCF-type ΔΣ DAC 800 including: a ΔΣ modulator 801; a DWA processor 802 that is electrically connected to the ΔΣ modulator 801; a two-tap analog FIR 803 that is electrically connected to the DWA processor 802; and the SCF 500 according to the present invention that is electrically connected to the two-tap analog FIR 803. As illustrated in FIG. 8, in the SCF-type ΔΣ DAC 800 according to the fourth embodiment of the present invention, as a substitute for the two-tap digital FIR 702 illustrated in the third embodiment, the two-tap analog FIR 803 is inserted to the next stage of the DWA processor 802.

Figure 9:
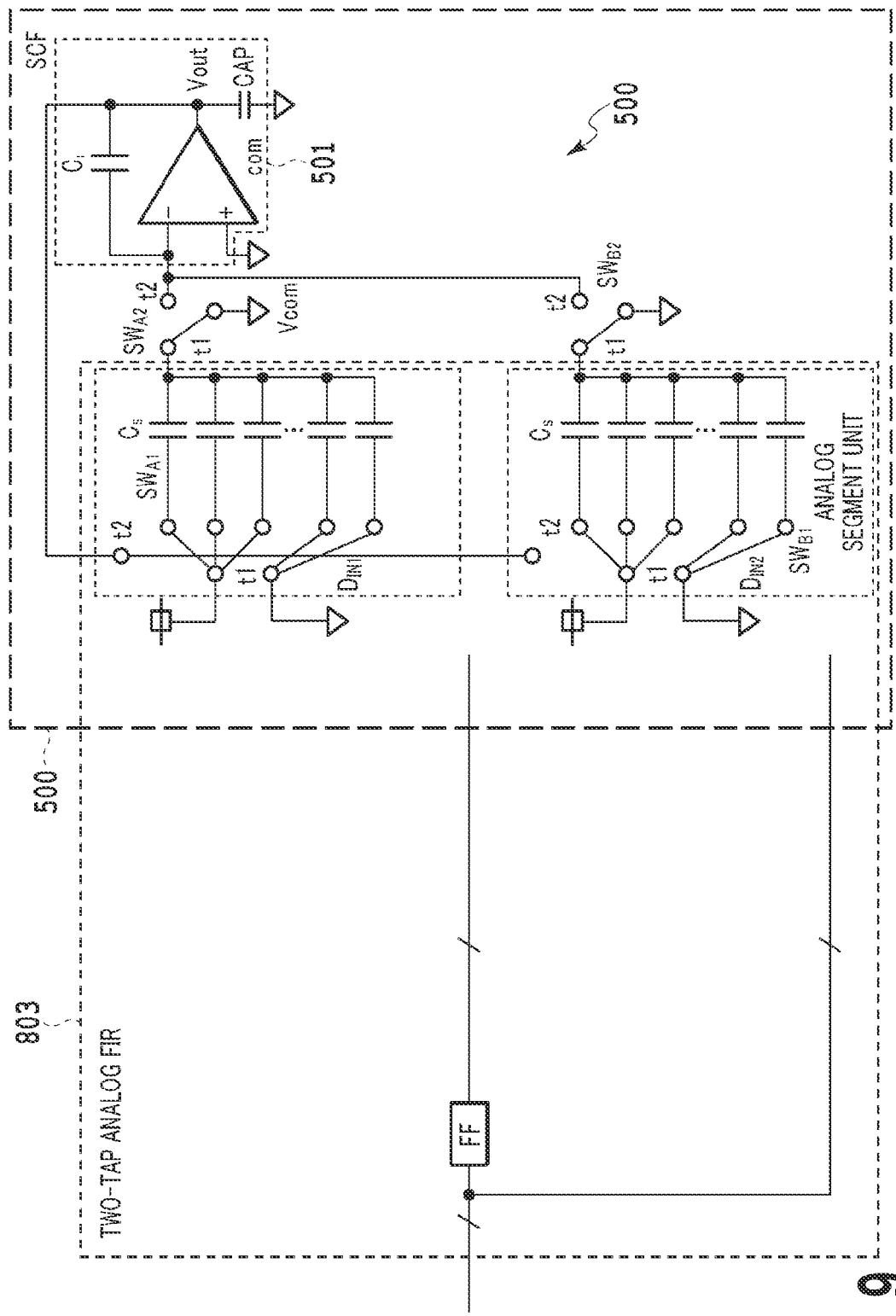
FIG. 9 is a configuration diagram of a two-tab analog FIR and an SCF illustrated in FIG. 8.

FIG. 9 illustrates a configuration diagram of the two-tab analog FIR 803 and the SCF 500 that is disposed on the next stage thereof. As illustrated in FIG. 9, an analog segment unit of the SCF 500 is shared with an analog addition unit of the two-tab analog FIR 803. The analog FIR is different from the digital FIR in that analog addition is used in an SCF operation using sampling capacitors Cs and Cs'. While this two-tap analog FIR 803 similarly forms a zero near ½·Fs, the two-tap analog FIR 803 executes analog addition of data having no delay and data having a delay of one. Accordingly, a gain error occurs between the data, whereby the zero cannot be accurately formed at ½·Fs.

However, relative to the case of the SCF-type ΔΣ DAC 700 using the two-tap digital FIR 702 according to the third embodiment, in the case of the SCF-type ΔΣ DAC 800 using the two-tap analog FIR 803 according to the fourth embodiment, the number of bits input to the DWA processor is small. Accordingly, the area of the DWA processor can be configured to be small.

As above, by employing the configurations illustrated in the third and fourth embodiments, a capacitor mismatch between the analog segment A group and the analog segment B group can be resolved, and a time-interleaved DAC having higher accuracy can be realized.

<Fifth Embodiment>

In a technology for correcting the capacitor mismatch according to this invention, three or more analog segments are arranged for two kinds of data, and a redundant analog segment is included. For example, for two kinds of data including even-numbered data and odd-numbered data, three analog segments are arranged, and a gain error between the the odd-numbered data and the even-numbed data can be eliminated by causing data to be in the rotation also between the analog segments. A specific rotation method will be illustrated in a fifth embodiment.

Figure 10:
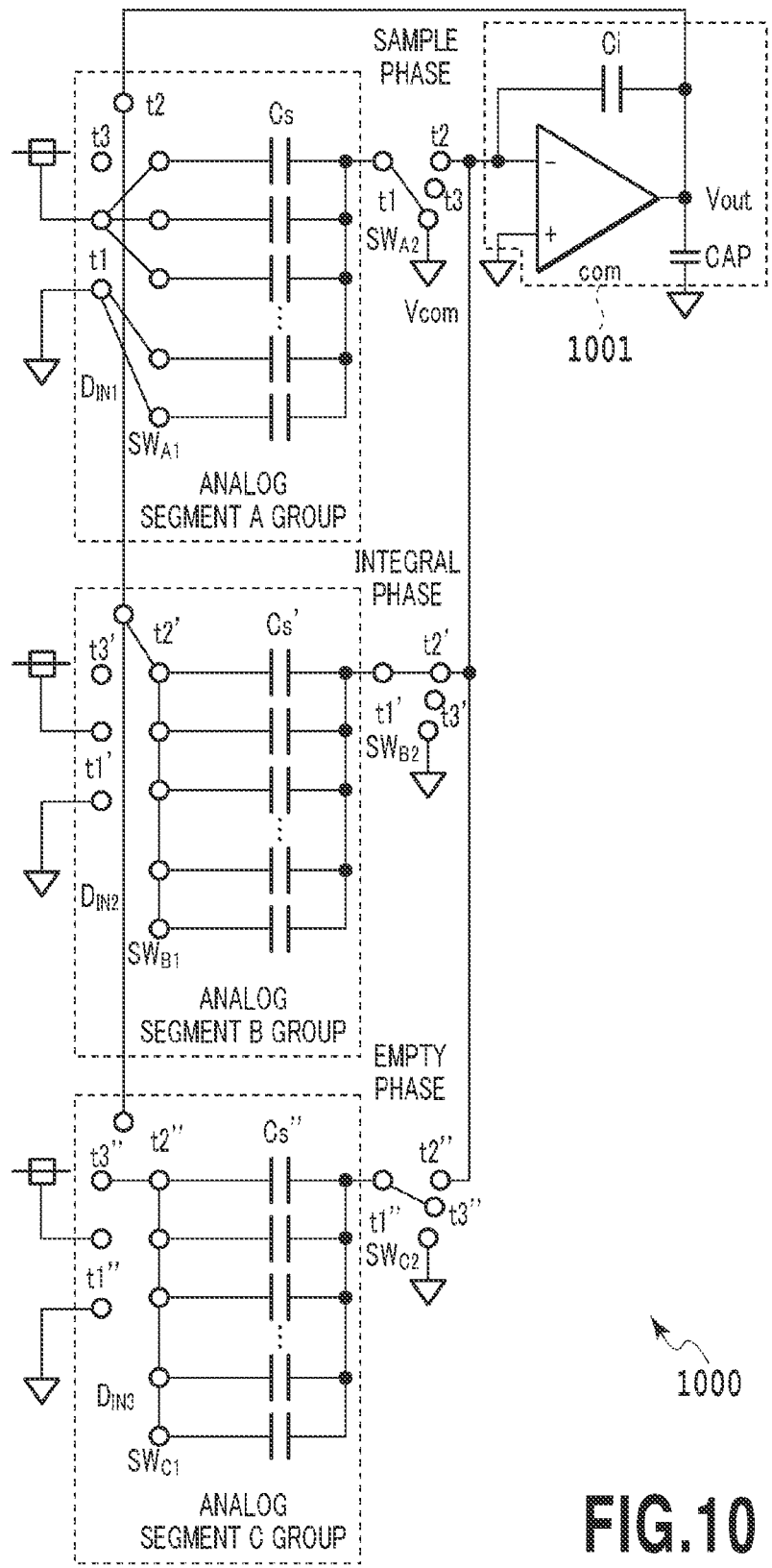
FIG. 10 is a configuration diagram of an SCF of a time-interleaved DAC according to a fifth embodiment of the present invention.

FIG. 10 is a configuration diagram of an SCF according to the fifth embodiment of the present invention. As illustrated in FIG. 10, an SCF 1000 of the time-interleaved DAC according to the fifth embodiment, includes: an analog segment A group; an analog segment B group; an analog segment C group; a first switch $SW_{A2}$; a second switch $SW_{B2}$; a third switch $SW_{C2}$; and a calculation unit 1001. The analog segment A group includes a first sampling switch group $SW_{A1}$ and a first sampling capacitor group Cs, the analog segment B group includes a second sampling switch group $SW_{B1}$ and a second sampling capacitor group Cs', and the analog segment C group includes a third sampling switch group $SW_{C1}$ and a third sampling capacitor group Cs". In addition, the calculation unit 1001 includes: an operational amplifier COM; an integration capacitor Ci; and a capacitor CAP. The SCF 1000 illustrated in FIG. 10 has a configuration acquired by adding the analog segment C group to the configuration of the SCF 500 of the time-interleaved DAC illustrated in FIGS. 5A and 5B.

The first switch $SW_{A2}$, the second switch $SW_{B2}$, and the third switch $SW_{C2}$ are respectively connected to the analog segment A group, the analog segment B group, and the analog segment C group. The negative-side input terminal of the operational amplifier COM is connected to the first switch $SW_{A2}$, the second switch $SW_{B2}$, and the third switch $SW_{C2}$. The integration capacitor Ci is connected in parallel with the negative-side input terminal of the operational amplifier COM and the output terminal of the operational amplifier COM. The capacitor CAP is connected to the output terminal of the operational amplifier COM.

The first sampling switch group $SW_{A1}$ and the first switch $SW_{A2}$ are switched to a first terminal t1 according to a clock $\phi 1$, are switched to a second terminal t2 according to a clock $\phi 2$, and are switched to a third terminal t3 according to a clock $\phi 3$. In addition, the second sampling switch group $SW_{B1}$ and the second switch $SW_{B2}$ are switched to a first terminal t1' according to a clock $\phi 1'$, are switched to a second terminal t2' according to a clock $\phi 2'$, and are switched to a third terminal t3' according to a clock $\phi 3'$. The third sampling switch group $SW_{C1}$ and the third switch $SW_{C2}$ are switched to a first terminal t1" according to a clock $\phi 1"$, are switched to a second terminal t2" according to a clock $\phi 2"$, and are switched to a third terminal t3" according to a clock $\phi 3"$.

When the first to third sampling switch groups $SW_{A1}$ to $SW_{C1}$ and the first to third switches $SW_{A2}$ to $SW_{C2}$ are respectively switched to the third terminals t3, t3', and t3", the analog segment A group, the analog segment B group, and the analog segment C group are in an empty phase of not being connected to the input terminal to which a digital input signal is input, a reference voltage, and the calculation unit 1001.

According to the SCF 1000 of the time-interleaved DAC of this embodiment, three analog segment groups of A, B, and C groups are arranged for two independent kinds of data (the odd-numbered data and the even-numbered data), and the analog segments corresponding to two kinds of data can be in the rotation according to the DWA by arranging the sampling capacitor groups each constantly having a time to spare.

As the rotation method of digital data for the analog segments, the analog segments are input to be in the rotation in order of A group→B group→C group for the odd-numbered data, and the analog segments are input to be in the rotation in order of B group→C group→A group for the even-numbered data, whereby a capacitor mismatch between the odd-numbered data and the even-numbered data can be resolved. As timing for proceeding to the next analog segment, when the integral phase ends, the process proceeds to the next analog segment, and sampling is started. The analog segment that is neither in the integral phase nor in the sampling phase is in the empty phase and thus is connected neither to the reference voltage nor to the integration capacitor Ci.

Figure 11:
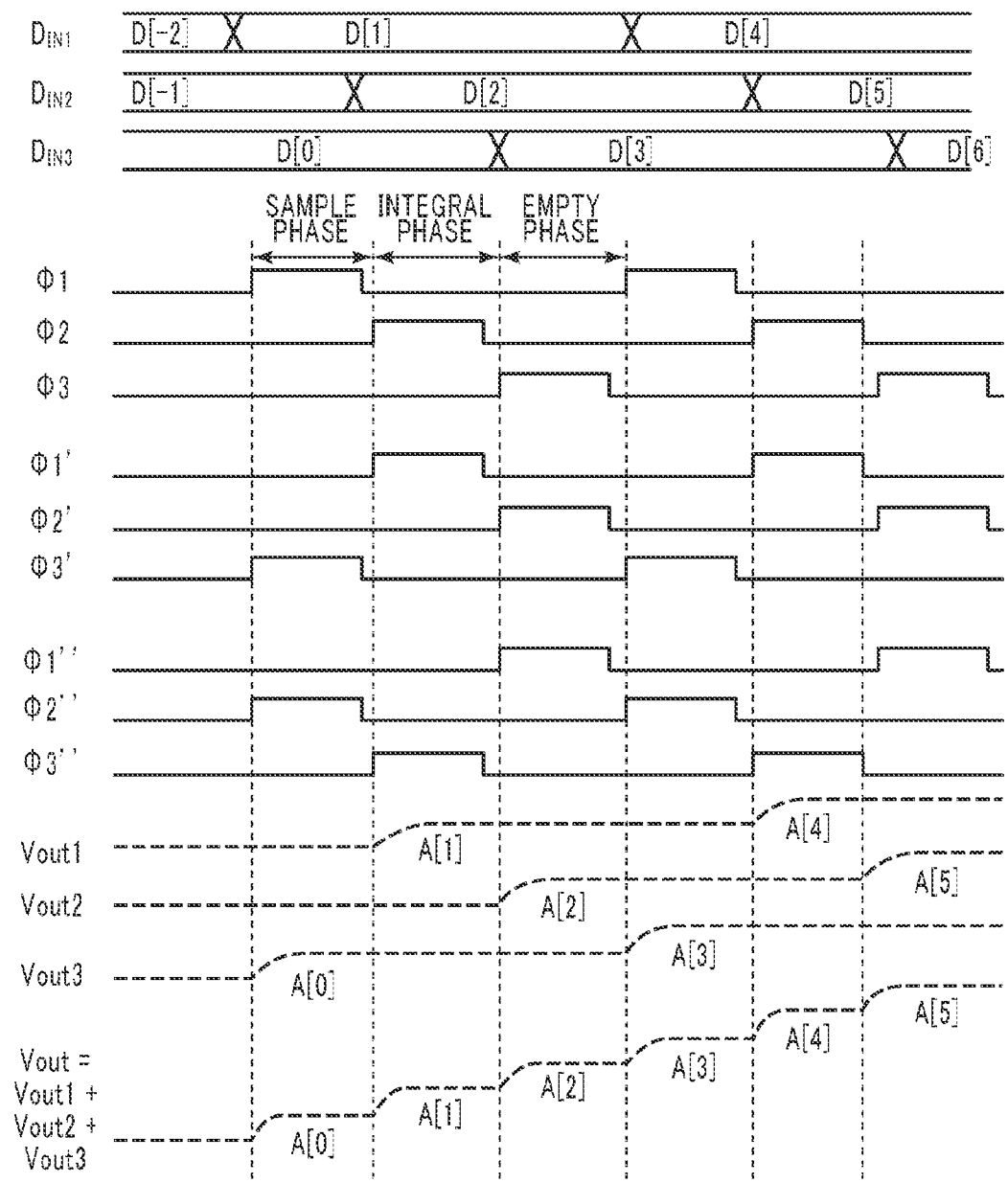
FIG. 11 is a timing diagram of the configuration illustrated in FIG. 10.

FIG. 11 is a timing diagram of the operation of the SCF 1000. The SCF 1000 according to the fifth embodiment, as illustrated in FIG. 11, divides the original data $D_{IN}$ into three parts including data $D_{IN1}$, data $D_{IN2}$, and data $D_{IN3}$ and inputs resultant data to the analog segment A group, the analog segment B group, and the analog segment C group, thereby forming an equivalent configuration. A section H of the clock $\phi 3$ is an added empty phase. The sampling, integral, and empty phases are repeated at timings of clocks $\phi 1$, $\phi 2$, and $\phi 3$ for the data $D_{IN1}$, whereby the data is converted from digital to analog into $V_{OUT1}$. Similarly, the sampling, integral, and empty phases are repeated at timings of clocks $\phi 1'$, $\phi 2'$, and $\phi 3'$ for the data $D_{IN2}$, whereby the data is converted from digital to analog into $V_{OUT2}$. In addition, the sampling, integral, and empty phases are repeated at timings of clocks $\phi 1"$, $\phi 2"$, and $\phi 3"$ for the data $D_{IN3}$, whereby the data is converted from digital to analog into $V_{OUT3}$. The final output $V_{OUT}$ is acquired by adding $V_{OUT1}$, $V_{OUT2}$, and $V_{OUT3}$.

According to this embodiment, redundancy is acquired by arranging three or more analog segments for two kinds of data including the even-numbered data and the odd-numbered data, and, by configuring the analog segments to be in the rotation according to DWA, a gain error between the odd-numbered data and the even-numbed data can be eliminated.

In the fifth embodiment, while only one set of the preliminary analog segment C group is prepared, one or more sets thereof may be prepared. In such a case, while the area of the analog segments is increased, a capacitor mismatch is further resolved, and accordingly, a time-interleaving operation having high accuracy can be realized.

In addition, in the third and fourth embodiments, while the configuration using the SCF 500 has been illustrated, a configuration using the SCF 1000 according to the fifth embodiment may be employed.

REFERENCE SIGNS LIST 100, 700, 800 SCF-type ΔΣ DAC
101, 701, 801 ΔΣ modulator
102, 703, 802 DWA processor
103, 300, 500, 1000 SCF
301 Analog segment unit
302, 501, 1001 Calculation unit
702, 803 Two-tab digital FIR
SW1, $SW_{A1}$, $SW_{B1}$, $SW_{C1}$ Sampling switch group
Cs, Cs', Cs" Sampling capacitor group
SW2, $SW_{A2}$, $SW_{B2}$, $SW_{C2}$ Switch
Ci Integration capacitor
COM Operational amplifier
CAP Capacitor

The invention claimed is:

1. A digital-analog converter comprising:
a first analog segment unit including a first sampling switch group and a first sampling capacitor group having a plurality of capacitors, the plurality of capacitors being charged according to a signal level of a first digital signal in a sampling phase;
a second analog segment unit including a second sampling switch group and a second sampling capacitor group having a plurality of capacitors, the plurality of capacitors being charged according to a signal level of a second digital signal in the sampling phase; and a calculation unit including an operational amplifier and an integration capacitor, the calculation unit outputting an analog signal according to a charged voltage of each capacitor of the first sampling capacitor group or a charged voltage of each capacitor of the second sampling capacitor group in an integral phase, the operational amplifier having a summing node and an output terminal, the integration capacitor being connected between the summing node and the output terminal, wherein, one analog segment unit of the first and second analog segment units is in the sampling phase and disconnected to the summing node while the other analog segment unit is in the integral phase and connected to the summing node.

2. The digital-analog converter according to claim 1, wherein the first sampling switch group is switched such that the first analog segment unit is connected to an input terminal inputting the first digital signal and a reference voltage in the sampling phase, and the first sampling switch group is switched such that the first analog segment unit is connected to the calculation unit in the integral phase, and wherein the second sampling switch group is switched such that the second analog segment unit is connected to an input terminal inputting the second digital signal and the reference voltage in the sampling phase, and the second sampling switch group is switched such that the second analog segment unit is connected to the calculation unit in the integral phase.

3. A digital-analog conversion device comprising:
a delta sigma modulator;
a data-weighted-averaging (DWA) processor electrically connected to the delta sigma modulator; and
the digital-analog converter according to claim 1 electrically connected to the DWA processor.

4. A digital-analog conversion device comprising:
a delta sigma modulator;
a two-tap digital FIR filter electrically connected to the delta sigma modulator;
a data-weighted-averaging (DWA) processor electrically connected to the two-tap digital FIR filter; and
the digital-analog converter according to claim 1 electrically connected to the DWA processor.

5. A digital-analog conversion device comprising:
a delta sigma modulator;
a data-weighted-averaging (DWA) processor electrically connected to the delta sigma modulator;
a two-tap analog FIR filter electrically connected to the DWA processor; and
the digital-analog converter according to claim 1 electrically connected to the two-tap analog FIR filter.

6. A digital-analog converter comprising:
three or more analog segment units each including a sampling switch group and a sampling capacitor group having a plurality of capacitors, the three or more analog segment units connected to an input terminal inputting a digital signal and a reference voltage in a sampling phase, the plurality of capacitors being charged according to a signal level of the input digital signal; and a calculation unit including an operational amplifier and an integration capacitor, in an integral phase, the calculation unit connected to one analog segment unit of the three or more analog segment units, and the calculation unit outputting an analog signal according to a charged voltage of each capacitor of the sampling capacitor group of the connected analog segment unit, wherein the three or more analog segment units sequentially inputs the digital signal, and wherein, when a first analog segment unit of the three or more analog segment units is in the sampling phase, a second analog segment unit of the three or more analog segment units is in the integral phase, and the other analog segment units of the three or more analog segment units are in an empty phase of not being connected to the reference voltage, the input terminal and the calculation unit.

7. The digital-analog converter according to claim 6, wherein the each sampling switch group of the three or more analog segment units is switched such that the analog segment unit is connected to the input terminal inputting the digital signal and the reference voltage in the sampling phase, the each sampling switch group is switched such that the analog segment unit is connected to the calculation unit in the integral phase, and the each sampling switch group is switched such that the analog segment unit is not connected to the reference voltage, the input terminal and the calculation unit in the empty phase.

8. A digital-analog conversion device comprising:
a delta sigma modulator;
a data-weighted-averaging (DWA) processor electrically connected to the delta sigma modulator; and
the digital-analog converter according to claim 6 electrically connected to the DWA processor.

* * * * *